April 1, 1969 D. H. GOBELI ET AL 3,436,647

PHASE SHIFTING CONTROL BY PHASE COMPARISON OF SIGNALS

Filed May 25, 1966

INVENTORS.
DAVID H. GOBELI
ARTHUR H. HARDY JR.
BY Bruce C. Lutz
ATTORNEY

United States Patent Office 3,436,647

Patented Apr. 1, 1969

3,436,647

PHASE SHIFTING CONTROL BY PHASE COMPARISON OF SIGNALS

David H. Gobeli, Minneapolis, and Arthur H. Hardy, Jr., St. Paul, Minn., assignors to Honeywell Inc., Minneapolis, Minn., a corporation of Delaware Filed May 25, 1966, Ser. No. 552,939

Int. Cl. G05f *1/68;* H02p *9/00*

U.S. Cl. 323—101 10 Claims

ABSTRACT OF THE DISCLOSURE

A precision phase shifting device which controls the phase shift over a wide range of frequencies by comparing the phase of the input and output signals and providing a control signal to a variable impedance when the phase shift varies from 90°.

This invention relates generally to electronic circuitry and more particularly to electronic circuitry which phase shifts an electronic signal flowing through it.

The prior art includes phase shifting circuits using feedback and phase shifting circuits without feedback. The phase shifting circuits which function without the use of feedback, open loop phase shifters, are normally mechanical type devices where an element of the circuit is changed mechanically to achieve the desired phase shift. These circuits have an inherent failing in that the phase shift setting is clearly dependent on frequency. The phase shifting circuits in the prior art which use feedback do not overcome this dependency on frequency. These circuits use feedback only to achieve much higher accuracy than is possible with open loop phase shifters. The circuits using feedback normally provide a signal of known phase, compare the input signal to the signal of known phase to form an error signal, and use the error signal formed to alter the phase shift network to achieve the desired phase. In addition to an extreme dependence on frequency, these circuits have the additional failing that a signal of known phase is required.

The present invention provides an extremely accurate phase shift while eliminating both the extreme dependency on frequency and the necessity for providing a signal of known phase. It does this because its error signal is formed from a comparison of the input and output wave forms, which are of the same frequency, instead of comparing the output to a single frequency standard to form an error signal. Since the error signal used to maintain the desired phase output is formed only from components of the input signal, the frequency limitation of the circuit lies only in the range of the phase shifting means used.

It is an object of this invention to provide an improved circuit which shifts the phase of an electronic signal flowing through it.

Further objects and advantages will become apparent from a reading of the specification and claims in conjunction with the figures wherein:

Figure 1:
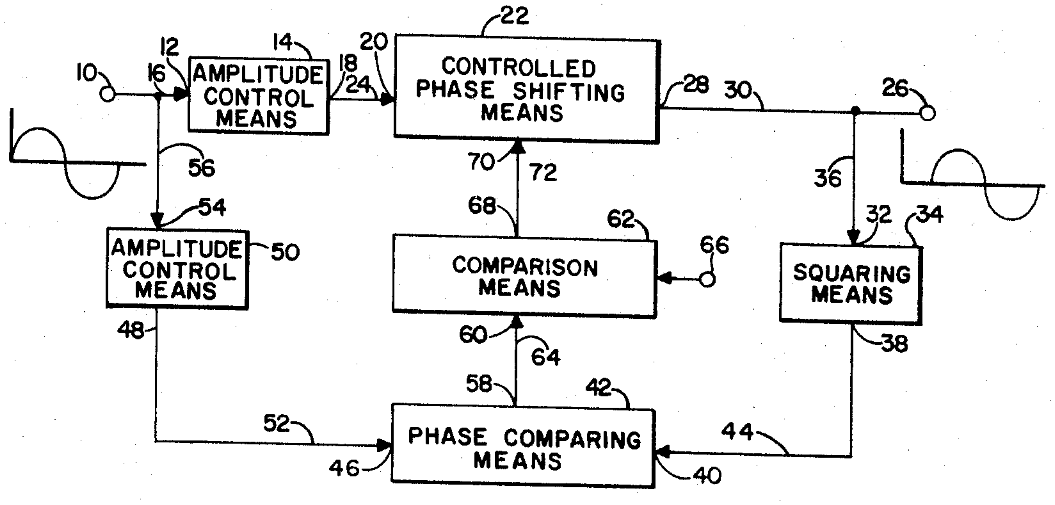
FIGURE 1 is one embodiment of the invention.

In FIGURE 1 an apparatus input means 10 is connected to an input means 12 of an amplitude control means 14 through a connection 16. An output means 18 of amplitude control means 14 is connected to an input means 20 of a controlled phase shifting means 22 through a connection 24. An apparatus output means 26 is connected to an output means 28 of phase shifting means 22 through a connection 30 and to an input means 32 of a squaring means 34 through a connection 36. An output means 38 of squaring means 34 is connected to a first input means 40 of a phase comparing means 42 through a connection 44. A second input means 46 of phase comparing means 42 is connected to an output means 48 of an amplitude control means 50 through a connection 52. An input means 54 to amplitude control means 50 is connected to apparatus input means 10 through a connection 56. An output means 58 of phase comparing means 42 is connected to an input means 60 of a comparison means 62 through a connection 64. Comparison means 62 has a reference signal input means 66. An output means 68 of comparison means 62 is connected to a control input means 70 of controlled phase shift means 22 through a connection 72.

Figure 2:
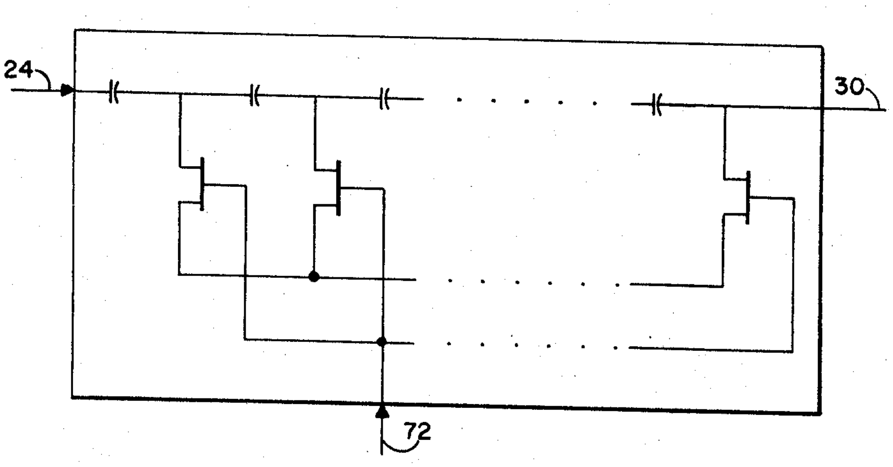
FIGURE 2 is a preferred embodiment of a block entitled phase shifting means within FIGURE 1.

FIGURE 2 shows a preferred embodiment of phase shifting means 22 of FIGURE 1.

The operation of this invention will now be discussed with reference to FIGURE 1. A signal from a supply means, which is to be phase shifted, appearing at apparatus input 10 is conducted through connection 16 to amplitude control means 14. Amplitude control means 14 is an adjunct of controlled phase shifting means 22 and alters the signal to whatever amplitude is necessary for controlled phase shifting means 22. It will be realized by those skilled in the art that amplitude control means 14 is not necessary in all embodiments. The signal is then conducted through connection 24 to controlled phase shifting means 22 where its phase is altered by the desired amount. The amplitude of the signal may be altered by the phase shifting means. The signal, phase shifted by the desired amount, is then conducted to the apparatus output means 26 through connection 30. The rest of the circuit is to insure that a correct phase shift is actually achieved. The input signal is also conducted through connection 56 to amplitude control means 50. Amplitude control means 50 alters the amplitude to whatever level is necessary for phase comparing means 42. It will be realized by those skilled in the art that amplitude control means 50 may not be necessary in all embodiments. The output signal is conducted through connection 36 to squaring means 34 and then through connection 44 to phase comparing means 42. In the preferred embodiment phase comparing means 42 is a chopper phase demodulator which requires a gating signal to control the chopping rate. Squaring means 34 provides this gating signal in the preferred embodiment. Even in the preferred embodiment, all that is necessary is another amplitude control means between apparatus output means 26 and phase comparing means 42. Squaring means 34 provides amplitude control while also providing a gating signal with very fast rise and fall times to increase the accuracy of the phase determination. An error signal appearing on connection 64 is the result of the phase comparison of the input and output and is proportional to that phase difference. This error signal is compared in comparison means 62 to a reference signal inserted at reference signal input means 66. If the error signal on connection 64 is not the same as the reference signal means inserted through reference signal input means 66, a control signal appears on connection 72 which alters phase shifting means 22 until the output fed back causes the error signal appearing on connection 64 to equal the reference signal inserted at reference signal input means 66. In the preferred embodiment the output of the chopper phase demodulator is a filtered DC waveform. It will be obvious to those skilled in that the DC value of a waveform resulting from a phase comparison of two sine waves or of a sine wave and a square wave all of the same frequency in a phase demodulator is (1) zero when the two waves are 90 degrees out of phase and (2) maximum when the two waves are identically in phase. Comparison means 62 in the preferred embodiment is a differential amplifier. Because the signal on connection 64 is a DC voltage in the preferred embodiment, the reference inserted at reference signal input means 66 is a DC voltage also.

The block diagram of FIGURE 1 shows a preferred embodiment of the present invention. This block diagram will be significantly altered if other embodiments are used. For instance, if phase comparing means 42 is relatively insensitive to the amplitude of signals inserted through input means 40 and input means 46, squaring means 34 and amplitude control means 50 are not necessary. This would be the case if phase comparing means 42 were, for example, a flip-flop with inputs attached to its set and reset inputs such that the output pulse length indicates the phase difference. Comparison means 62 is a differential amplifier in the preferred embodiment; however, comparison means 62 might take the form of a signal translation circuit or high-gain DC amplifier. In the case where a 90 degree phase shift is desired, output 58 of phase comparing means 42 will yield a zero signal output, for the phase comparing means used in the preferred embodiment. In this case, only a high-gain DC amplifier is necessary to provide whatever bias voltage is needed by controlled phase shifting means 22 to provide a 90 degree phase shift in response to a substantially zero output from phase comparing means 42. Any signal translating means which accepts a substantially zero signal and provides the bias necessary may be used such as a battery or resistor bias circuit. This is not the most accurate embodiment, however, because any drift in the bias output which is used to control controlled phase shifting means 22 will induce a phase error in the system. This is why a differential amplifier is used in the preferred embodiment; it is much more accurate. Phase shifts other than 90 degrees may be achieved by a proper conversion of whatever signal appears at output means 58 of phase comparing means 42 to whatever signal will maintain the desired phase shift, as required by controlled phase shifting means 22. For example, if the signal appearing at output means 58 of phase comparing means 42 is a DC voltage and the signal necessary to control controlled phase shifting means 22 is a DC signal, then only a DC bias change is necessary to achieve any desired phase shift.

FIGURE 2 comprises capacitors and field effect transistors connected as shown to form a multistage R-C phase shift network. A field effect transistor has the property that its drain to source resistance changes with gate to source voltage. This effect allows a field effect transistor to be used as a voltage controlled resistance. It is used in this manner in FIGURE 2. A control voltage inserted through connection 72 alters the resistance of each of the field effect transistors in FIGURE 2. This alteration of resistance changes the phase shift which would be experienced by a sine wave signal inserted through connection 24 and removed through connection 30. Thus, through the use of cascaded stages employing a capacitor and a field effect transistor, a simple R-C phase shift network may be constructed which will give a large variation of phase shifts over a wide range of frequencies.

It will be obvious to those skilled in the art that: the phase shifting means may be any electronically controllable phase shifter, for example a servo mechanism driven potentiometer in conjunction with a capacitor to form an R-C phase shifter. The comparison means 62 will usually comprise a differential amplifier, but may be any means which compares inputs and yields an output based on a difference in amplitude or other signal characteristic. The phase comparing means 42 may be any means which compares inputs and yields an output in response to the phase difference between inputs. For example, the phase comparing means 42 could be a flip-flop with inputs attached to its set and reset inputs such that the output pulse length indicates the phase difference, a phase demodulating diode bridge, or a chopper demodulator. The reference signal will naturally depend on what signal appears on connection 64 or what signal is necessary to provide an adequate comparison. This is the reason for use of a filtered DC signal on connection 64 in the preferred embodiment; it allows a simple DC reference. It will also be obvious to those skilled in the art that a multifrequency signal may be operated on by using this invention to exactly phase shift only one frequency and allowing the remainder of the frequencies to follow or using many separate circuits such that there is one for each frequency of interest. It will again be obvious to those skilled in the art that power supplies which are not shown may be necessary to provide bias to certain blocks in the block diagram.

Other alterations and variations will be obvious to those skilled in the art. We do not wish to be limited by the specification or the figures shown but only by the following claims.

We claim:

1. Apparatus for phase shifting signals through the use of feedback comprising in combination:
- supply means for supplying signals;
- controlled phase shifting means, said controlled phase shifting means phase shifting any signal applied to it in response to a control signal;
- first connection means connecting said supply means to said controlled phase shifting means;
- phase comparing means, said phase comparing means providing an output proportional to the phase difference between signals supplied to it;
- apparatus output means for utilizing the phase shifted signal from said controlled phase shifting means;
- second connection means connecting said supply means to said phase comparing means;
- third connection means connecting said controlled phase shifting means to said phase comparing means and to said apparatus output means;
- comparison means, said comparison means providing an output signal in response to a difference in signals supplied to it;
- reference signal means;
- fourth connection means connecting said reference signal means to said comparison means;
- fifth connection means connecting said phase comparing means to said comparison means; and
- sixth connection means connecting said comparison means to said controlled phase shifting means, the output signal of said comparison means controlling the phase of signals through said controlled phase shifting means.

2. The apparatus of claim 1 wherein said second connection means includes means for controlling the amplitude of any signals flowing therethrough.

3. The apparatus of claim 2 wherein:
- said first connection means includes means for controlling the amplitude of any signal flowing therethrough; and
- said third connection means includes means for controlling the amplitude of any signal flowing therethrough.

4. The apparatus of claim 3 wherein said third connection means includes means for shaping a sine wave into a square wave of the same frequency.

5. The apparatus of claim 3 wherein said first connection means includes means for shaping a sine wave into a square wave of the same frequency.

6. The apparatus of claim 3 wherein:
- said third connection means includes means for shaping a sine wave into a square wave of the same frequency; and
- said first connection means includes means for shaping a sine wave into a square wave of the same frequency.

7. Apparatus for phase shifting an electronic signal comprising in combination:
- first means for providing a source of electronic signals;

second means connected to said first means for phase shifting any electronic signals from said first means;
third means connected in electrical parallel with said second means, said third means providing an output proportional to the phase difference across said second means; and
fourth means connected between said third means and said second means, said fourth means controlling said second means in response to outputs from said third means.

8. Apparatus for providing a phase shift to an electronic signal comprising in combination:
first means for phase shifting including input means, output means, and control input means;
second means for comparing two signals and providing an output proportional to the phase difference between those signals including first input means, second input means, and output means;
third means connecting said input means of said first means to said second input means of said second means and said output means of said first means to said first input means of said second means;
fourth means for comparing two signals and providing an output proportional to a difference between those two signals including input means, output means, and reference signal input means;
fifth means for providing a reference signal; and sixth means connecting said output means of said second means to said input means of said fourth means, said fifth means to said reference signal input means of said fourth means, and said control input means of said first means to said output means of said fourth means.

9. The apparatus of claim 8 wherein said third means includes amplitude control means in the connection between said input means of said first means and said first input means of said second means.

10. The apparatus of claim 8 wherein said third means includes amplitude control means both in the connection between said input means of said first means and said second input means of said second means and between said output means of said first means and said first input means of said second means.

References Cited

UNITED STATES PATENTS 3,337,743 8/1967 Rolfes ------------ 323—106 X

JOHN F. COUCH, *Primary Examiner.*

G. GOLDBERG, *Assistant Examiner.*

U.S. Cl. X.R.

307—87, 262; 323—108, 129; 328—155